United States Patent

[11] 3,599,118

[72] Inventor David J. Large
Sunnyvale, Calif.
[21] Appl. No. 866,919
[22] Filed Oct. 16, 1969
[45] Patented Aug. 10, 1971
[73] Assignee Kruse-Storke Electronics
Mountain View, Calif.

[54] VARACTOR TUNED NEGATIVE RESISTANCE DIODE MICROWAVE OSCILLATORS
2 Claims, 7 Drawing Figs.

[52] U.S. Cl. .......... 331/96, 331/101, 331/102, 331/107 R, 331/107 G, 331/177 V, 332/30 V, 333/34, 333/82 B
[51] Int. Cl. .......... H03b 7/14
[50] Field of Search .......... 331/96, 101, 102, 107 R, 107 G, 107 T, 177 V; 317/234 V; 332/30 V; 333/34, 82 B

[56] References Cited
UNITED STATES PATENTS

| | | | |
|---|---|---|---|
| 2,900,610 | 8/1959 | Allen et al. .......... | 333/82 B X |
| 3,231,831 | 1/1966 | Hines .......... | 331/96 |
| 3,377,568 | 4/1968 | Kruse, Jr. et al. .......... | 331/101 X |
| 3,397,365 | 8/1968 | Kruse, Jr. et al. .......... | 331/102 |
| 3,460,055 | 8/1969 | Josenhans et al. .......... | 331/107 X |
| 3,465,265 | 9/1969 | Kuru .......... | 331/107 G X |

*Primary Examiner*—Roy Lake
*Assistant Examiner*—Siegfried H. Grimm
*Attorneys*—Jack M. Wiseman and Thomas E. Schatzel

ABSTRACT: A varactor tuned oscillator circuit comprising an outer conductor of a TEM line and an inner conductor comprised of varactor means in series with an active two terminal solid state power generation device driving the line.

INVENTOR.
DAVID J. LARGE
BY Jack M. Wiseman
Thomas Schatzel
ATTORNEYS

INVENTOR.
DAVID J. LARGE
BY Jack M. Wiseman
Thomas C. Schatzel
ATTORNEYS

VARACTOR TUNED NEGATIVE RESISTANCE DIODE MICROWAVE OSCILLATORS

BACKGROUND OF THE INVENTION

The present invention relates to electrically tuned oscillator networks.

In the prior art, there are various broadband electrically tunable oscillators in which the oscillating frequency is selected by electronically controlling variable impedance means within the oscillator by controlling current flow or applied voltage to impedance elements. In general, these oscillators require the use of electron tubes (backward wave oscillators, voltage tuned magnetrons) YIG (yttrium-iron-garnet) tuned solid-state devices or transistors in combination with variable capacitance diodes and/or variable resistance diodes. Electron tubes generally have limited life, are relatively bulky and require high voltage power supplies for operation. YIG devices utilize active devices and magnetic field variable properties of a YIG sphere as a tuning device requiring use of an electromagnet structure to create the desired magnetic field. The electromagnet adds weight to the structure and consumes power, often as much as the active device itself. Further, due to the properties of the magnet core material and magnetic circuit design, the oscillator will have a limited rate of tuning (sweep speed) and some hysteresis on the setting of frequency. The tuning power consumed adds to the total dissipated power and, hence, to the temperature rise in the device and the total power consumption of the unit. Transistor structures are frequency range limited.

U.S. Pat. No. 3,377,568 discloses a voltage-tuned oscillator in which variable-capacitance diodes are connected back-to-back in a transmission line structure in series with a transistor as a resonant load circuit for generating a signal. U.S. Pat. No. 3,397,365 discloses a voltage-tunable oscillator in which two pairs of variable-capacitance diodes are connected back-to-back and symmetrically disposed in a transmission line. The transmission line is excited by a pair of transistors driving the line in push-pull relationship. U.S. Pat. No. 3,416,100 described an oscillator with a voltage controlled phase shift circuit, which phase shift circuit comprises varactors and PIN diodes. The present invention particularly enables improved operation in a voltage-tuned oscillator.

Varactor Tuned Integrated Gunn Oscillators have been described in an article entitled "Varactor-Tuned Integrated Gunn Oscillators" by G. E. Brehm, published on Feb. 15, 1968 International Solid-State Circuits Conference on page 78 and in an article entitled "Bulk-effect modules pave way for sophisticated uses" by George King and J.S. Heeks, published on page 94 of the Feb. 3, 1969, issue of Electronics.

SUMMARY OF THE PRESENT INVENTION

An electrically tuned oscillator in which the resonant load comprises a transverse electromagnetic field transmission line with an active two-terminal, solid-state power generation device to drive the line. The active device may be in the form of the Gunn effect diode, avalanche diode, IMPATT diode, TRAPATT diode, LSA diode, et cetera. These devices exhibit some negative resistance region at microwave frequencies at some bias level. The circuit operates within a TEM (transverse electromagnetic field) mode in any of various line configurations, e.g. coaxial, stripline, microstrip, slotline, et cetera. Wideband tuning may be realized by select variations of voltage on two or more semiconductor devices acting as voltage variable capacitance (varactors) in series with the line center conductor to modify the effect of the reactance of the active device at the desired frequency. Required tuning power is small since the diodes are continuously biased, either reverse biased or forward biased to small currents. Power output may be coupled from the circuit at any of various points by either direct connection to the circuit, capacitive coupling or inductive coupling. At the same time, the frequency modulation bandwidth can be wide relative to those structures utilizing magnetic devices and since varactors for microwave frequencies are much smaller than the electromagnets required for YIG devices, the entire oscillator can be very small. Thus, the present invention is adapted to provide a compact, rugged, lightweight low power consumption oscillator tunable over a wide range of frequencies.

The present invention is an improvement over known varactor tuned diode oscillators, because the existing devices are of a narrow tuning range, such as 34 percent of the center frequency and whereas the apparatus of the present invention is capable of achieving a tuning range greater than 66 ⅔ percent of the center frequency.

DESCRIPTION OF THE PREFERRED EMBODIMENT

Figures 1, 2:
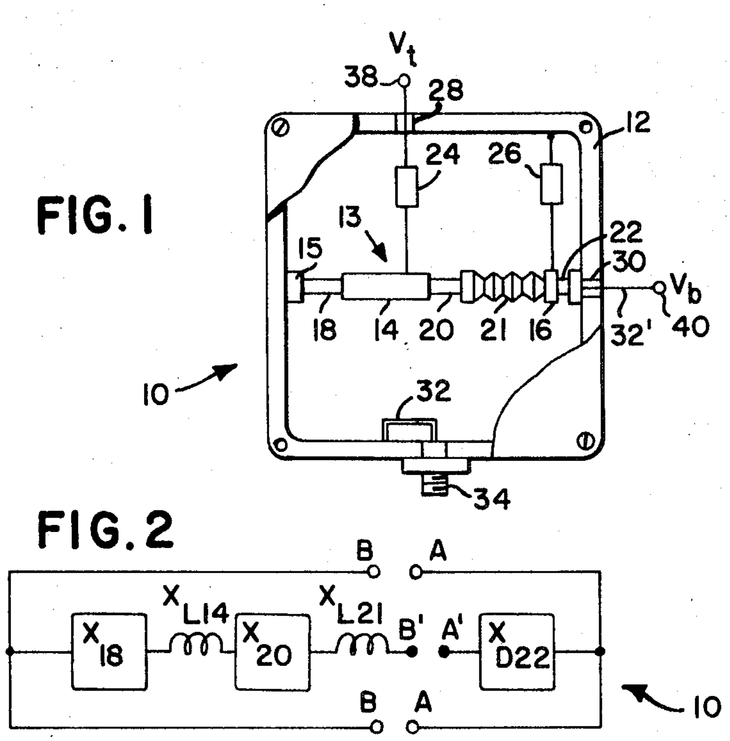
FIG. 1 is a diagrammatic top plan view of the oscillator embodying the present invention with the top cover of a hollow rectangular transmission line structure thereof removed.
FIG. 2 is a diagrammatic illustration of the electrical circuit of the oscillator shown in FIG. 1.
Figure 3:
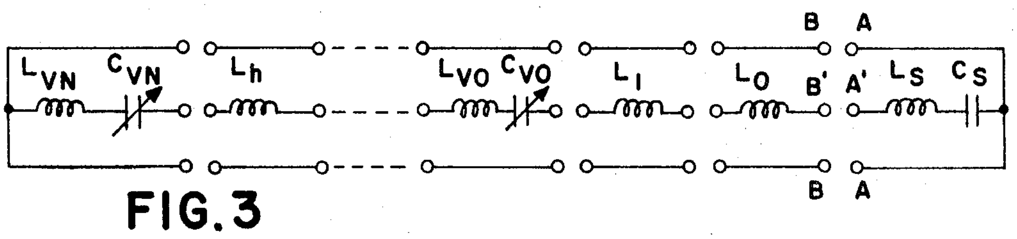
FIG. 3 is a schematic diagram of a simplified equivalent electrical circuit within a desired tuning range of the type of oscillator shown in FIG. 2.

Illustrated in FIGS. 1—3 is the tunable oscillator circuit 10 of the present invention, which comprises a hollow rectangular transmission line structure 12 made of a suitable conducting material, such as brass, and serves as the outer conductor of a TEM mode transmission line. Within the housing 12 is a tuning line referred to by the general reference character 13 and mounted lengthwise within the structure 12. The tuning line 13 includes a first line section in the form of an inductive metallic rod 14. End metallic rods 15 and 16 may be attached at opposite ends of the line. Supported intermediate the rods 14 and 15 is a variable impedance means in the form of a varactor diode 18. A second varactor diode 20 is positioned intermediate the rod 14 and a second line section 21 which assumes the pattern of bellows to relieve mechanical stress.

An active two-terminal power generation device, e.g. a Gunn diode 22, is electrically connected to the line section 21 through the end rod 16 abutting the housing 12. A radio frequency choke 24 extends from the center rod 14 to the exterior of the housing 12. A second radio frequency choke 26 extends from the junction of the rod 16 and the Gunn diode 22. The oscillator further incorporates a first bypass capacitor 28 in capacitive relationship with the inductor 24 and housing 12. A second bypass capacitor 30 is in capacitive relationship to a bias lead 32' leading to the device 22. The output of the oscillator 10 is taken via an internal loop coupler 32 extending through the housing 12 to an external cable connector 34 from which are transmitted the oscillator signals generated by the oscillator 10. The generated frequencies for the oscillator 10 are over a range from 3 GHz. to 11 GHz. Input tuning voltage to the varactors 18 and 20 is provided by a bias source $V_t$ at a terminal 38 joined to the choke 24. Select values in the voltage $V_t$ selects the frequency generated by the oscillator 10 by regulating the capacitance of the varactors 18 and 20. Bias $V_b$ for the Gunn diode 22 is applied to a terminal 40 extending through the capacitor 30. The utilization of this type of bias arrangement is exemplary. By utilizing two or more varactors a wider and improved tuning range is achieved for the oscillator 10.

The electrical equivalent schematic for the structure of FIG. 1 is illustrated in FIG. 2. The radio frequency chokes 24 and 26 and the bias capacitors 28 and 30 are primarily utilized for biasing and for purposes of analysis of the tuning mechanism, the chokes have been replaced by open circuits and the bypass capacitors by short circuits. In FIG. 2, the Gunn diode 22 (active device) presents a complex impedance $X_{D22}$ at the terminals A–A'. The real part of the impedance $X_{D22}$ is a negative resistance which may be utilized to drive load power. The conjugate of the imaginary part of $X_{D22}$ is connected at terminals B–B' for proper tuning.

The remainder of the circuit 10 consists of the varactors 18 and 20, the impedance of which is respectively represented by $X_{18}$ and $X_{20}$. The lumped short line sections of the inductive rods 14 and 21 are represented by the inductor symbols $X_{L14}$ and $X_{L21}$. The inductance of the rod 15 is lumped into the inductance represented by the symbol $X_{L14}$. In the same manner, the inductance of the rod 16 is lumped into the inductance represented by the symbol $X_{L21}$. The values of the line sections 14, 15, 16 and 21 and types of varactors 18 and 20 are chosen so that the variation in impedance at B–B' as the voltage on the varactors 18 and 20 is varied presents the conjugate of the imaginary part of the impedance $X_{D22}$ at the terminals A–A' over the desired frequency range. In selecting the generating frequency of the oscillator 10, the capacitance of the varactors 18 and 20 varies inversely as a function of the bias voltage applied thereto.

Viewing FIG. 3, the reactive components of the various elements are illustrated. $L_s$ and $C_s$, respectively, represent the inductance and capacitance of the active device 22. $L_o$, $L_1$...$L_n$ represent the inductance of the individual line segments, e.g. line segments 14, 15, 16 and 21. $Cv_o$, $Cv_l$...$Cv_n$; $Lv_o$, $Lv_l$...$Lv_n$ represent, respectively, the inductance and capacitance offered by the varactors, e.g. the varactors 18 and 20. The capacitance of each varactor varies with the bias potential As illustrated, depending on the frequency band requirements, the number of line sections, number of varactors and type of varactors utilized may vary so that there is variation in the impedance at B–B' as the voltage on the varactors is varied to present the conjugate of the impedance at A–A' over the desired frequency range.

The operation is essentially the same whether the active device 22 is at the end of the line, in the middle or another point along the line. In the example, placement of the device 22 at one end abutting the housing 12 facilitates heat transfer. Further, depending on the specific frequency tuning considerations, line sections may be necessarily omitted.

Figure 4:
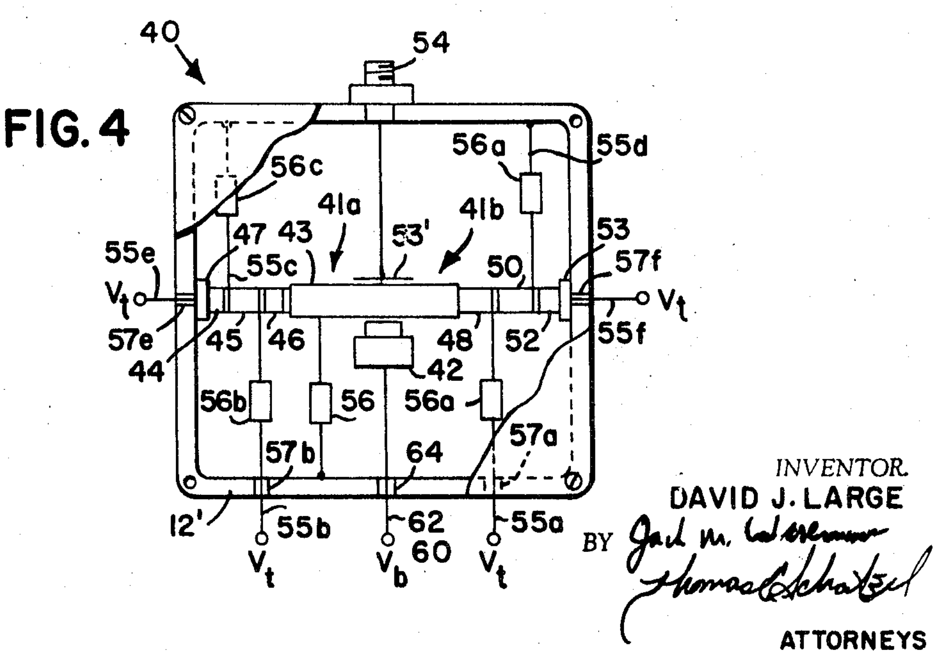
FIG. 4 is a diagrammatic top plan view of a modification of the oscillator shown in FIG. 1 with the top cover of a hollow rectangular transmission line structure thereof removed and particularly illustrating a split tuning line.

FIG. 4 illustrates a modification of the oscillator shown in FIG. 1 in the form of a split-tuning line oscillator referred to by the general reference character 40. Like elements have been designated with the same reference numeral but with a prime suffix. A plurality of tuning lines 41*a* and 41*b* are connected in common to an active device 42. In FIG. 4, the active device 42 is secured to the housing 12'. The line 41*a* and 41*b* are common to a line segment 43. The line 41*a* includes a set of three varactors 44, 45 and 46 connected in series. The varactor 44 is joined to an end rod 47 abutting the housing 12'. The line 41*b* includes a set of three varactors 48, 50 and 52 connected in series with each other and the line segment 43. The varactor 52 is joined to an end rod 53 abutting the housing 12'.

Figure 5:
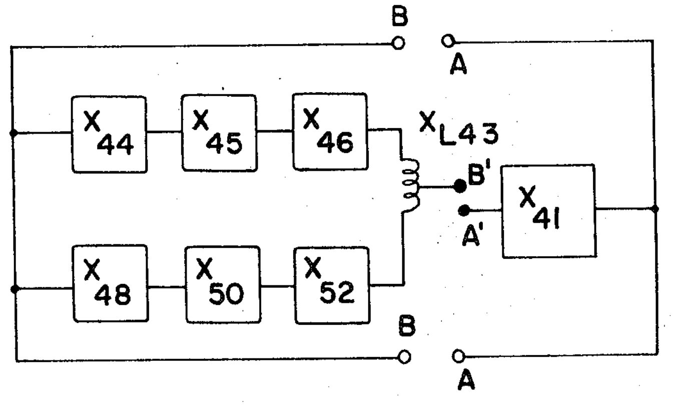
FIG. 5 is a diagrammatic illustration of the electrical circuit of the oscillator shown in FIG. 4.

Electrically, as illustrated by FIG. 5, the circuit of FIG. 4 differs from that of FIG. 2 in that rather than one tuning line being connected to point A–A' as in FIG. 2, both the lines 41*a* and 41*b* are connected in electrical parallel with the common line segment 43. Both the lines 41*a* and 41*b* offer an impedance $X_{41}$. The line segment 43 offers an impedance $X_{L43}$ which may be center tapped to offer an equal impedance to each line. The varactors 44, 45 and 46, respectively, offer reactance components $X_{44}$, $X_{45}$ and $X_{46}$ in the line 41*a* while the varactors 48, 50 and 52, respectively, offer a line of reactance of components $X_{44}$, $X_{45}$ and $X_{46}$ in the line 41*a* while the varactors 48, 50 and 52, respectively, offer a line of reactance of components $X_{48}$, $X_{50}$ and $X_{46}$ in the line 41*a* while the varactors 48, 50 and 52, respectively, offer a line of reactance of components $X_{48}$, $X_{50}$ and $X_{52}$ in the line 41*b*. The split-tuning arrangement has been found to allow for higher frequency operation than that of FIGS. 1—3 while utilizing similar components. Output from the oscillator 40 is taken via a capacitive coupler 53' to the line segment 43 and extending to an output terminal 54. Bias leads 55*a* and 55*b* may extend from the line segment 43 to the exterior of the housing 12' through a coupling inductor 56*a*—56*b*, respectively and a bypass capacitor 57*a*—57*b*, respectively. Bias leads 55*c* and 55*d* are grounded to the housing 12' through coupling inductors 56*c* and 56*d*. Bias leads 55*e* and 55*f* are connected to the rods 47 and 53, respectively, through bypass capacitors 57*e* and 57*f*, respectively. The input tuning voltage $V_t$ is applied to the bias leads 55*a*, 55*b*, 55*e* and 55*f*. The bias potential $V_b$ for the active device 42 is applied at a terminal 60 for a lead 62 which extends through a bypass capacitor 64 to the interior of the housing 12'.

Figure 6:
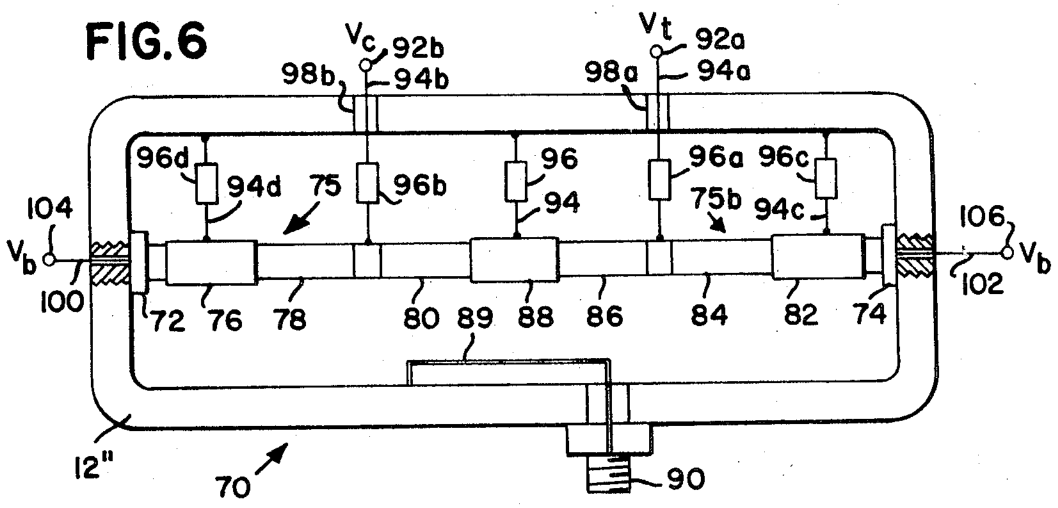
FIG. 6 is a further modification of the oscillator shown in FIG. 1 to illustrate a push-pull relation.

FIG. 6 illustrates a further modification of the oscillator 10 in the form of a push-pull oscillator, referred to by the general reference character 70. Like elements have been designated with the same reference numeral with a double prime suffix. The oscillator 70 may be viewed as two one-sided circuits electrically similar to the circuit of the oscillator 10 of FIG. 1, connected together with active devices 72 and 74 at opposing ends of tuning lines 75*a* and 75*b*, respectively. The device 72 joins a line section 76 in series with a pair of back-to-back varactors 78 and 80. The device 74 joins a line section 82 in series with a pair of back-to-back varactors 84 and 86. The varactors 80 and 86 join a common center rod 88. The output for the oscillator 70 may be taken from a coupling loop 89 extending externally to a cable connector 90. The bias potential $V_t$ is applied to terminals 92*a* and 92*b* of conductors 94*a* and 94*b*, respectively, which are in series with coupling inductors 96*a* and 96*b*. A bypass capacitance 98*a* and 98*b* are established with the conductors 94*a* and 94*b*, respectively. Bias conductors 94*c* and 94*d* are grounded to the housing 12'' through coupling inductors 96*c* and 96*d*, respectively. Bias $V_b$ for the devices 72 and 74 is respectively applied through conductors 100 and 102, by way of terminals 104 and 106, respectively. The oscillator 70 is arranged such that in operation, the active devices 72 and 74 generate out-of-phase signals tuned by the varactors in the associated leg. If identical coupling is achieved by the two circuit halves, the signals will be 180° out of phase and the even harmonics of the fundamental oscillation frequency cancelled and not present in the output. Also, the physical length of the circuit determines the length of the coupling loop which may be convenient in some applications. It has also been found that for a comparable power input more power output is available with a push-pull structure similar to the oscillator 70 over that of a single device.

Figure 7:
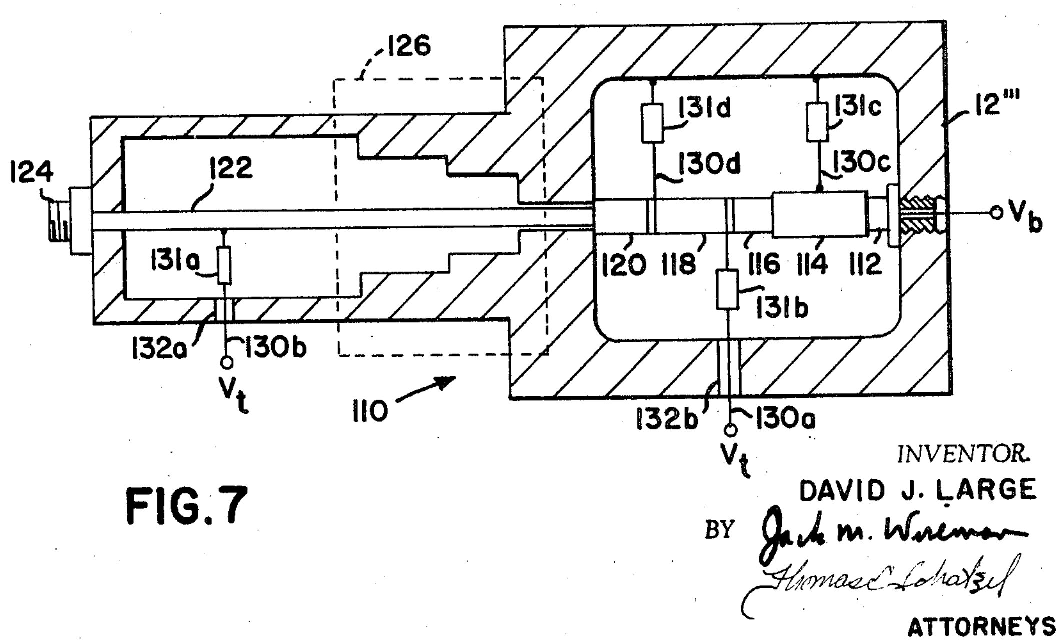
FIG. 7 is a further modification of the oscillator shown in FIG. 1 to illustrate a transformer coupling.

FIG. 7 illustrates a still further modification of the oscillator 10 in the form of a broadband transformer coupling oscillator referred to by the general reference character 110. Again, like reference numerals for the like parts have been employed with the suffix triple prime. The oscillator 110 includes an active device 112 joined at one end to the housing 12''' and extending to a line section 114. The line section 114 joins a plurality of back-to-back varactors 116, 118 and 120 joined in series. Output for the oscillator 110 is taken off a line 122 extending to an output terminal 124. Coupling is realized by transforming the output load impedance (Zo) of the line 122 through an impedance transformer illustrated within the housing section designated by a broken line 126 to an appropriate impedance matching valve for loading the oscillator. The active device 112 is tuned by the varactors 116, 118 and 120. Bias lines 130*a* and 130*b* have a bias voltage $V_t$ applied thereto and are serially connected to coupling inductors 131*a* and 131*b* through bypass capacitors 132*a* and 132*b*, respectively. Bias leads 130*c* and 130*d* are grounded to the housing 12''' through coupling inductors 131*c* and 131*d*. The oscillator 110 has been found to operate advantageously with a relative broadband coupling with relative uniform coupling.

It is to be understood that mention herein to a transit time diode refers to the type of diode exhibiting a Gunn effect.

I claim:

1. An electrically tuned oscillator comprising, in combination:

a transmission line structure;

a tuning line disposed along an axis of transmission of said structure, the tuning line including a plurality of variable impedance devices disposed intermediate the ends thereof for forming a resonant circuit therewith;

variable voltage means connected to said variable impedance devices for controlling the impedance thereof to select a resonant frequency for said resonant circuit;

an active two-terminal power generation device for generating a signal, said active two-terminal power generation device being electrically connected to said tuning line, said tuning line serving as a load impedance to said active two-terminal power generation device and resonant with the said active two-terminal power generation device impedance over a band of frequencies in response to said variable voltage means controlling the impedance of said variable impedance devices; and output means coupled to said tuning line for removing a generated signal, the tuning line includes a plurality of line segments, each line segment includes at least one of said variable impedance devices disposed intermediate the ends thereof, the line segments being in electrical parallel relation relative to one another and each extending to an active device.

2. The electrically tuned oscillator of claim 1 in which all line segments extend to a common active device.